Figure 1:
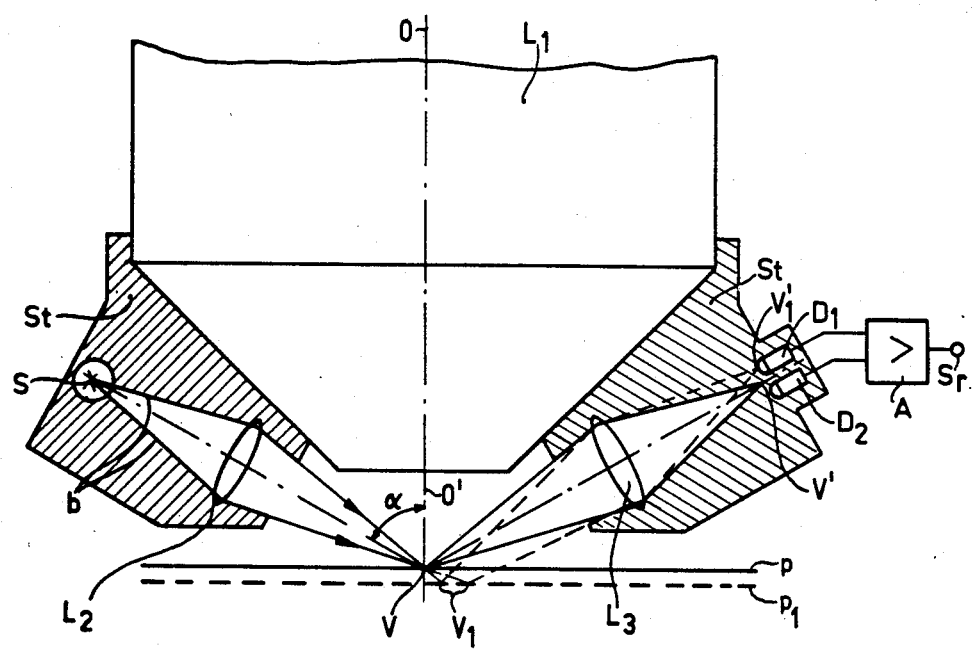

United States Patent

Wittekoek et al.

[11] 4,356,392
[45] Oct. 26, 1982

[54] OPTICAL IMAGING SYSTEM PROVIDED WITH AN OPTO-ELECTRONIC DETECTION SYSTEM FOR DETERMINING A DEVIATION BETWEEN THE IMAGE PLANE OF THE IMAGING SYSTEM AND A SECOND PLANE ON WHICH AN IMAGE IS TO BE FORMED

[75] Inventors: Stefan Wittekoek; Theodorus A. Fahner, both of Eindhoven, Netherlands

[73] Assignee: U.S. Philips Corporation, New York, N.Y.

[21] Appl. No.: 158,653

[22] Filed: Jun. 11, 1980

[30] Foreign Application Priority Data

Dec. 6, 1979 [NL] Netherlands .................. 7904579

[51] Int. Cl.³ .............................. G01J 1/20
[52] U.S. Cl. .................... 250/201; 250/561
[58] Field of Search ........... 250/561, 577, 572, 216, 250/560, 201, 204; 356/356, 4, 1

[56] References Cited

U.S. PATENT DOCUMENTS 3,775,012  11/1973  Ling et al. ............... 250/560
4,136,949  1/1979   Hayamizu et al. ......... 356/4
4,212,534  7/1980   Bodlaj ..................... 356/1

Primary Examiner—David C. Nelms
Attorney, Agent, or Firm—Thomas A. Briody; Robert T. Mayer; Algy Tamoshunas

[57] ABSTRACT

An optical imaging system is described which is provided with an opto-electronic detection system for determining a deviation between the image plane of the imaging system and a second plane on which an image is to be formed by the imaging system. After a first reflection on the second plane an auxiliary beam which is obliquely incident on said plane is reflected along itself and mirror-inverted, is subsequently reflected a second time on the second plane, and is finally incident on two detectors. The difference signal of the detectors, which is a measure of the deviation, is unaffected by tilting of the second plane and by local variations in reflectivity of in said plane.

5 Claims, 3 Drawing Figures

OPTICAL IMAGING SYSTEM PROVIDED WITH AN OPTO-ELECTRONIC DETECTION SYSTEM FOR DETERMINING A DEVIATION BETWEEN THE IMAGE PLANE OF THE IMAGING SYSTEM AND A SECOND PLANE ON WHICH AN IMAGE IS TO BE FORMED

The invention relates to an optical imaging system provided with an opto-electronic detection system for determining a deviation between the image plane of the imaging system and a second plane on which an image is to be formed by the imaging system, which detection system comprises a radiation source which produces an auxiliary beam, a reflection element which is disposed in the path of the auxiliary beam which has been reflected a first time by the second plane and which directs the auxiliary beam again towards the second plane, and two radiation-sensitive detectors disposed in the path of the auxiliary beam which has been reflected twice by the second plane, the detectors and the reflection element being connected to the imaging system and the difference between the output signals of the two detectors being a measure of the said deviation.

Lens systems used for imaging small details have a large numerical aperture and thus a small depth of focus. In this type of lens systems, which are for example employed for imaging a mask pattern on a substrate for the manufacture of integrated circuits, it is important to detect a deviation between the actual plane of imaging, for example, the mask pattern, and the plane on which the image is to be formed, for example the substrate so as to enable the lens system to be re-adjusted by means thereof.

It is possible to determine such deviation capacitively. The lens system should then be connected to a metal plate and the surface of the substrate should be metallized. The variation of the capacitance constituted by the metal plate and the metallized surface is a measure of the deviation. The deviation could also be measured with an airpressure sensor. The drawback of these methods is that the distance measurement must be effected outside the field of the imaging system. Furthermore, the distance between the capacitive sensor or the air-pressure sensor and the second plane, for example the surface of the substrate, on which the image is to be formed is very small, so that the occurrence of damage to the sensor or the substrate surface is not unlikely. An optical method of determining the deviation is more attractive, because in that case measurement is possible in the centre of the field of the imaging system and the detection elements can be arranged at a comparatively large distance from the plane on which the image is to be formed.

U.S. Pat. No. 3,264,935 describes how such an optical method may be employed in a slide projector. An auxiliary beam is directed at the slide to be projected at a large angle of incidence. The angle of incidence is the angle between the auxiliary beam and the optical axis of the projection lens sytem. The auxiliary beam which is reflected by the slide is incident on the plane of two reflection-sensitive detectors. When the slide is moved along the optical axis of the projection lens system, the auxiliary beam will travel over the detector. By comparison of the electric output signals of said detectors, an indication is obtained of the magnitude and direction of the deviation between the actual and the desired position of the slide.

In order to prevent the difference signal of the detectors from being affected be tilting of the slide, the detection system in accordance with U.S. Pat. No. 3,264,935 includes a reflection element in the radiation path of the auxiliary beam which has been reflected for a first time by the slide, which element again directs the auxiliary beam towards the slide. The detectors are disposed in the radiation path of the auxiliary beam which has been reflected twice by the slide.

Such an imaging system may also be employed in a device for imaging a mask pattern on a semiconductor substrate for the manufacture of integrated circuits. Especially for such an application the detection system exhibits the drawback it is sensitive to local differences in reflection of the substrate. An integrated circuit is formed in a number of process steps, in which consecutively the various mask patterns are to be imaged on the substrate. When imaging a mask pattern the structures already formed on the substrate in a previous process step may cause scattering. As a result of this scattering the two halves of the radiation spot formed on the two detectors may have different intensities, whilst the distance between the substrate and the imaging lens system is correct.

It is the object of the present invention to provide a detection system which does not have this drawback. The system in accordance with the invention is characterized in that there is provided a first lens system ($L_2$) for focussing a narrow auxiliary beam (b) to a small radiation spot (V) on the second plane (P). The system further includes a second lens system for imaging the radiation spot on the reflection element and a the reflection element is a beam-reversing element (retroreflector) (r, $L_3$), so that the beam is reflected along itself and is focussed by the second lens system ($L_3$) in the radiation spot (V) formed when the auxiliary beam is incident on the second plane for a first time.

The expression auxiliary beam being reflected "along itself" is to be understood to mean that the chief ray of the reflected auxiliary beam coincides with the chief ray of the auxiliary beam which is incident on the beam inverting element, and that the light rays which in said incident auxiliary beam form part of the first and the second beam half respectively form part of the second and the first beam half in the reflected auxiliary beam. Of the auxiliary beam which is directed towards the detectors both beam halves have been incident on both halves of the area on the second plane, or substrate, covered by the radiation spot. As a result of this the intensity of both beam halves is influenced to the same extent by any local differences in reflection in said area of the second plane, so that the intensity difference between the two beam halves is independent of said differences in reflection.

In the detection system in accordance with U.S. Pat. No. 3,264,935 it is merely of importance that the auxiliary beam is reflected twice by the slide. It is not necessary that the auxiliary beam impinges twice on the slide at exactly the same location. Neither is the size of the auxiliary beam of importance. For the detection system in accordance with the invention, however, it is essential that a narrow auxiliary beam impinges twice in precisely the same area of the second plane.

The detection system in accordance with the invention may be employed to great advantage in apparatus for the repeated imaging of a mask pattern on a substrate, which apparatus comprises a projection lens system arranged between a mask-pattern holder and a substrate holder, the detection system being employed for determining a deviation between the image plane of the projection lens system and the substrate. In addition, the invention is generally applicable in imaging systems where local differences in reflection may occur in the plane in which the image is to be formed, or where said plane may exhibit tilting. Examples of this are microscopes, both reflection microscopes and transmission microscopes. Because of the oblique incidence of the auxiliary beam, a transparent object will also reflect an amount of radiation which is sufficient to be used for the detection of a variation in the distance between the object to be examined and the microscope objective.

The invention will now be described in more detail, by way of example, on the basis of a system for imaging a mask pattern on a substrate. For this reference is made to the drawing, in which FIG. 1, schematically, represents an imaging system provided with a known opto-electronic detection system.

Figure 2:
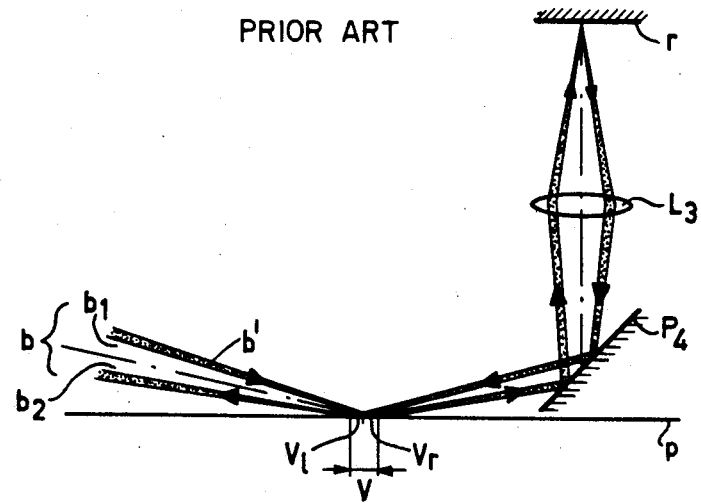
Figure 3:
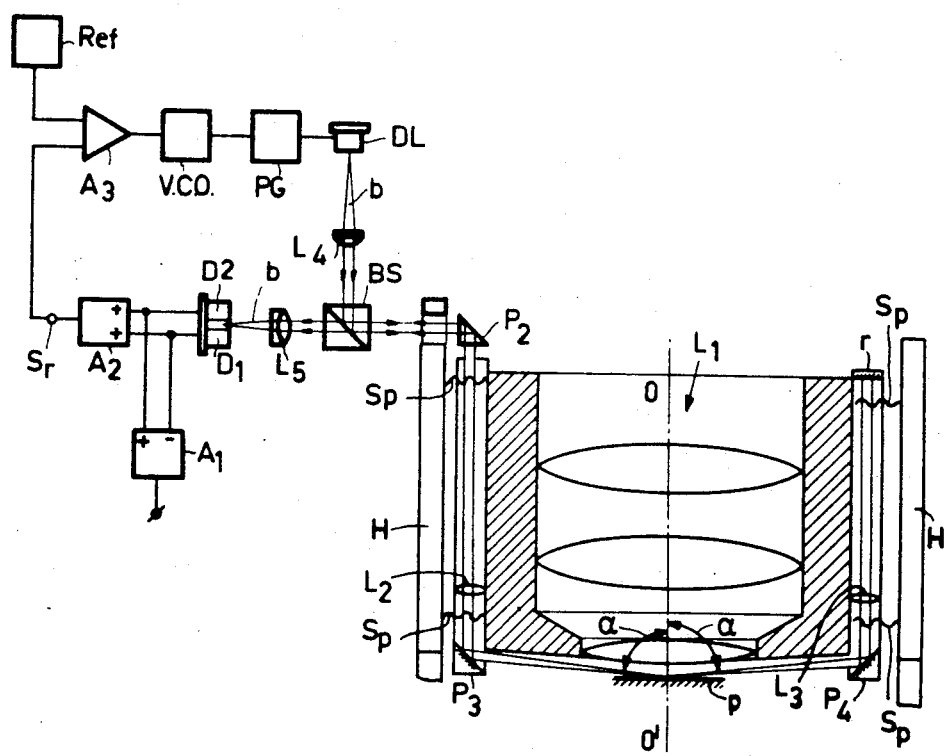

FIG. 2 illustrates the principle of the detection system in accordance with the invention, and FIG. 3 shows an embodiment of such a system.

In FIG. 1 an imaging system is designated $L_1$. An opto-electronic detection system comprises a radiation source S, which emits an auxiliary beam b, a first lens $L_2$, a second lens $L_3$, and two detectors, for example photo-diodes, $D_1$ and $D_2$. The detection system is rigidly connected to the lens system $L_1$ via the supports $S_t$.

The lens $L_2$ forms a radiation spot V on the plane p in which an image is to be formed by the lens system $L_1$. The lens $L_3$ images said radiation spot on the photo-diodes $D_1$ and $D_2$. Relative to the lens system $L_1$, the detection system is aligned so that the lens $L_3$ images the intersection of the optical axis $00'$ of the system $L_1$ with the image plane of said system in the plane of the two detectors $D_1$ and $D_2$. If the plane p coincides with the image plane of the system $L_1$ the radiation spot V is imaged in the spot V', which is situated symmetrically relative to the detectors $D_1$ and $D_2$. These detectors then receive equal radiation intensities. The output signal $S_r$ of a differential amplifier A which is connected to the detectors $D_1$ and $D_2$ is then, for example, zero. In the case of a variation of the distance between the plane p and the lens system $L_1$ the image V' of the radiation spot V is moved over the detectors $D_1$ and $D_2$. If, as is shown in FIG. 1, the plane p is moved downwards, the radiation spot $V_1$ formed on said plane is imaged in $V'_1$ in accordance with the radiation path represented by the dashed lines. The detector $D_1$ then receives a greater radiation intensity than the detector $D_2$ and the signal $S_r$ is for example positive. In the case of an upward movement of the plane p the reverse occurs, and the detector $D_1$ receives a smaller radiation intensity than the detector $D_2$. The signal $S_r$ is then for example negative. The signal $S_r$ may be applied to a servo-system, not shown, by means of which the position of the lens system $L_1$ can be corrected.

The angle of incidence $\alpha$ at which the auxiliary beam b is incident on the plane p is selected to be as great as possible, for example of the order of 80°, in order to obtain a maximum sensitivity to positional errors of the plane p relative to the lens system $L_1$ and in order to obtain a maximum reflection of the auxiliary beam by the plane p.

In accordance with the invention the path of the beam b which has been reflected by the plane p includes a beam-inverting element or retro-reflector. Such a retro-reflector may be constituted by a so-termed "cats-eye," which, as is shown in FIG. 2, comprises a lens $L_3$ and a mirror r, the mirror being arranged in the focal plane of the lens $L_3$. Such a "cats-eye" reflects a beam along itself. FIG. 2 shows only the part of the path of the beam b in the vicinity of the plane p. The beam b forms the radiation spot V on said plane. The beam that has been reflected by the plane p is directed to the mirror r by the reflection prism $P_4$. After reflection at this mirror the beam b traverses the same path in the reverse direction.

A small portion b' of the beam b is shown dark in order to indicate how this part traverses the radiation path. Upon the first arrival at the plane p this part is a portion of the beam half $b_1$. The beam portion b' is then situated in the right-hand part $V_r$ of the radiation spot V. After reflection at the plane p and at the reflection prism $P_4$ the beam portion b' passes through the left-hand part of the lens $L_3$. Upon reflection at the mirror r the beam portion b' passes through the right-hand part of the lens $L_3$ and is then situated in the left-hand part $V_1$ in the radiation spot V. After double reflection at the plane p the beam portion b' has become part of the beam half $b_2$. This applies to all beam portions forming the bean half $b_1$. Thus, after double reflection at the plane p the beam half $b_1$ has been in contact both with the right-hand part and with the left-hand part of the area on the plane p underneath the radiation spot V. Obviously, the same applies to the beam half $b_2$. As a result of this neither local differences in reflection as a result of scattering structures in the plane p nor irregularities in this plane or an oblique position of this plane relative to the lens system $L_1$ can affect the intensity distribution over the beam halves $b_1$ and $b_2$.

The detection system in accordance with the invention may alternatively employ a concave mirror or a combination of a plane mirror and a cylindrical lens as inverting element; with a magnification of $-1$.

FIG. 3 shows an embodiment of a detection system in accordance with the invention for use in an apparatus for imaging mask patterns on a substrate. The surface of the substrate is represented by the plane p and the projection lens system by $L_1$. This system is movable along its optical axis $00'$ by drive means, known per se and not shown, which are controlled by the signal $S_r$, derived from the signals, from the two detectors. In directions perpendicular to the optical axis $00'$ the projection lens system is immobile in its housing H. As indicated in FIG. 3, the projection lens system may be secured in the housing H by means of springs $S_p$. Instead of springs it is alternatively possible to employ diaphragms as fixing means.

In an apparatus for the repeated imaging of a mask pattern on a substrate the projection column and the substrate are movable relative to each other in two mutually perpendicular directions. For more details about such an apparatus reference is made to Netherlands Patent Application No. 65.06548 (PHN 8429), which has been laid open for public inspection. Furthermore, it is to be noted that in such a device the image plane of the projection lens system substantially coincides with the focal plane of this system.

In order to ensure that for small displacements of the plane p relative to the lens system $L_1$, a sufficiently large signal $S_r$, i.e. a sufficiently large difference between the radiation intensities on the two detectors, is obtained, the radiation spot V should have a high brightness. Therefore, a laser is preferably used as radiation source S. The radiation beam b produced by the laser should be stable. Preferably, a semiconductor-diode laser, DL in FIG. 3, for example, an AlGaAs diode laser is used, which can be arranged close to the substrate. It is alternatively possible to employ a gas laser, which is arranged at a larger distance from the substrate, the radiation of said laser being passed to the substrate via a light-conducting fibre.

The laser beam b is converted into a parallel beam by the lens $L_4$ and is subsequently directed to the substrate surface p via reflection at the beam splitter BS and the reflection prisms $P_2$ and $P_3$. The lens $L_2$ forms the radiation spot V on the substrate. Subsequently the beam b traverses the radiation path described with reference to FIG. 2. A part of the beam b which has been reflected twice by the substrate surface is transmitted to the two detectors $D_1$ and $D_2$ by the beam splitter BS. The lens $L_5$ forms an image of the radiation spot V on these detectors.

The beam splitter BS may comprise the semitransparent mirror of a semitransparent prism. Alternatively it is possible to employ a polarization splitting prism, the radiation path between said prism and the substrate including a $\lambda/4$ plate, where $\lambda$ represents the wavelength of the beam b. The radiation from the source DL is then polarized in such a way that it is reflected by the polarization splitting prims. The beam b then traverses the $\lambda/4$ plate twice, as a result of which the plane of polarization of the radiation, that is reflected twice by the substrate 3 is rotated through 90° in total, so that the beam is then transmitted by the prism.

The difference signal $S_r$ of the two detectors $D_1$ and $D_2$ is primarily determined by the distance between the image plane of the projection lens system $L_1$ and the plane p. However, this signal is also dependent on the total intensity of the auxiliary beam b which has been reflected twice by the plane p. This intensity may vary as a result of a variation in the radiation-source intensity or as a result of variations in the reflection or transmission coefficients of the optical elements in the radiation path.

In order to eliminate the effect of variations in the total beam intensity which is incident on the detectors $D_1$ and $D_2$, the output signals of the detectors may be added, yielding a sum signal $S_t$. In an analog divider circuit the signal $S'_r = S_r/S_t$ can then be derived, which signal is a measure of the positional error of the plane p of the substrate relative to the projection lens system and which is independent of intensity variations of the radiation source and of variations in the reflection or transmission coefficients in the radiation path. In order to ensure that in the case of poor reflection or transmission coefficients, an amount of radiation is obtained on the detectors which is sufficient for the required accuracy, the radiation source should be set to a maximum radiation power. This may lead to a reduction of the life of the radiation source, especially if this source is a semiconductor diode laser. Furthermore, a drift-free analog divider is a comparatively expensive element.

The afore-mentioned drawbacks can be avoided, in accordance with a preferred embodiment of the detection system in accordance with the invention, by using the sum signal $S_t$ for controlling the intensity of the radiation source so that the total radiation intensity which is incident on the detectors $D_1$ and $D_2$ remains constant. If the radiation source is a radiation-emitting diode the magnitude of the electric current with which said radiation source is driven may then be corrected for this purpose.

A semiconductor diode laser, for example an AlGaAs laser, is preferably operated with current pulses, because this is most favourable for the life of such a laser. However, the angle at which such a laser emits its radiation can vary when the magnitude of the electric current through the laser is varied. The intensity of the radiation which is emitted by a diode laser is suitably corrected by varying the pulse repetition rate of the electric current pulses at constant pulse width.

As is shown in FIG. 3, the signals from the detectors $D_1$ and $D_2$ are applied to a subtractor circuit $A_1$, on whose output the signal $S_r$ appears, and to an adder circuit $A_2$, on whose output a signal $S_t$ is available. The signal $S_t$ may for example be applied to an input of a differential amplifier $A_3$, whose other input is connected to a reference source Ref. The output of the differential amplifier is connected to an oscillator VCO, which supplies a train of pulses whose frequency is determined by the voltage on its input. The output of the oscillator is connected to a pulse generator PG. The electric current required for the operation of the diode laser DL is supplied by the pulse generator in the form of pulses of constant duration and with a repetition rate which is equal to that of the pulses from the oscillator VCO. The average intensity of the diode laser could also be controlled by adapting the duration of the electric current pulses instead of adapting the pulse repetition rate.

The setting of the diode laser is such that for the maximum radiation loss to be anticipated in the radiation path the total amount of radiation incident on the detectors just suffices to attain the required accuracy, which is inter alia determined by the leakage current and the noise of the detectors. In the case of smaller radiation losses the radiation source need emit a smaller radiation intensity, which is favourable for the life of the source.

The displacement $\Delta$ of the radiation spot over the photo-diodes $D_1$ and $D_2$ is given by:

$$\Delta = 4.M.H. \sin \alpha.$$

In this formula H is the displacement of the plane p, $\alpha$ the angle of incidence of the focussing beam on said plane, and M the magnification of the lens system $L_5 L_2$. This magnification is equal to the ratio of the focal length of the lens $L_5$ to that of the lens $L_2$. As the focussing beam has been reflected twice by the plane p, the sensitivity of the detection system has also increased by a factor 2. As a result of this a factor 4 instead of a factor 2 occurs in the above expression for the displacement $\Delta$.

In a realized embodiment of a detection system in accordance with the invention a displacement of the plane p over only 0.1 $\mu$m could still be detected in a satisfactory manner.

What is claimed is:

1. In an optical system for imaging an object such as a mask pattern or the like, an apparatus for detecting a deviation between an image plane of the imaging system and a second plane on which the object is to be imaged, said apparatus comprising means for producing an auxiliary beam of radiation which is directed toward said second plane along a first path and is reflected from said second plane along a second path, means disposed in said first path for focusing said beam to a first spot on said second plane, means disposed in said second path for directing the beam reflected by said second plane back along itself towards said second plane, said directing means being coupled to said imaging system and comprising means for inverting the beam directed back along said second path and focusing the inverted beam to a second spot at the location of said first spot on said second plane so that said beam is reflected a second time by said second plane, and radiation-sensitive detector means disposed in the path of said beam reflected for said second time, said detecting means producing an electrical signal representative of the deviation of said image plane from said second plane.

2. The system according to claim 1 wherein said directing means includes a reflective element disposed in said second path and a lens system disposed in said second path between said reflecting element and said second plane and arranged to image said first spot onto said reflective element and to focus said inverted beam to said second spot.

3. The system according to claims 1 or 2 wherein said detector means includes a pair of radiation sensitive detectors each having an output and being arranged so that both of said detectors are illuminated substantially equally by said beam reflected for a second time from said second plane when said image plane and second plane coincide, and a subtractor circuit coupled to said outputs of said detectors, said subtractor circuit producing said electrical signal representative of said deviation.

4. The apparatus according to claim 3 including means for controlling the intensity of said auxiliary beam and an adder circuit coupled to said outputs of said detectors, said adder circuit having an output coupled to said controlling means which in response to a signal at said output of said adder circuit corrects the intensity of said auxiliary beam so that the sum of the detector signals remains constant.

5. The system according to claim 4 wherein said beam producing means includes a semiconductor diode laser which emits radiation pulses and said control circuit comprises an oscillator which is controlled by the signal at the output of said adder circuit, the output of said oscillator being connected to an electric current source which controls said diode laser.

* * * * *